(12) United States Patent
Miyata

(10) Patent No.: US 10,958,039 B2
(45) Date of Patent: Mar. 23, 2021

(54) OPTICAL MODULE

(71) Applicant: NICHIA CORPORATION, Anan (JP)

(72) Inventor: Tadaaki Miyata, Yokohama (JP)

(73) Assignee: NICHIA CORPORATION, Anan (JP)

( * ) Notice: Subject to any disclaimer, the term of this patent is extended or adjusted under 35 U.S.C. 154(b) by 7 days.

(21) Appl. No.: 16/357,910

(22) Filed: Mar. 19, 2019

(65) Prior Publication Data
US 2019/0296520 A1    Sep. 26, 2019

(30) Foreign Application Priority Data
Mar. 20, 2018    (JP) .............................. JP2018-052126

(51) Int. Cl.
| | | |
|---|---|---|
| *H01S 5/10* | (2006.01) | |
| *H01S 5/022* | (2021.01) | |
| *G02B 6/42* | (2006.01) | |
| *H01S 5/026* | (2006.01) | |
| *G02F 1/39* | (2006.01) | |

(Continued)

(52) U.S. Cl.
CPC .............. *H01S 5/1032* (2013.01); *G02B 6/42* (2013.01); *G02F 1/3501* (2013.01); *G02F 1/395* (2013.01); *H01L 31/0232* (2013.01); *H01S 5/022* (2013.01); *H01S 5/026* (2013.01); *H01S 5/1085* (2013.01); *G02F 2001/3509* (2013.01)

(58) Field of Classification Search
CPC .... H01S 5/02248; H01S 5/4012; H01S 5/021; H01S 5/4093; H01S 5/1032; H01S 5/1085; G02B 6/42; G02F 1/395; G02F 1/35
See application file for complete search history.

(56) References Cited

U.S. PATENT DOCUMENTS

| | | |
|---|---|---|
| 5,313,543 A | 5/1994 | Matsuda et al. |
| 5,940,557 A | 8/1999 | Harker |

(Continued)

FOREIGN PATENT DOCUMENTS

| | | |
|---|---|---|
| JP | H06160930 A | 6/1994 |
| JP | H07209560 A | 8/1995 |

(Continued)

OTHER PUBLICATIONS

Wiedmann, J., et al., Compact green laser source using butt-coupling between multi-section DFB-laser and SHG waveguide crystal, Electronics Letters, Dec. 4, 2008, vol. 44, No. 25, 3 pages.

*Primary Examiner* — Yuanda Zhang
(74) *Attorney, Agent, or Firm* — Hunton Andrews Kurth LLP

(57) ABSTRACT

There is provided an optical module comprising a semiconductor laser element; and a planar lightwave circuit (PLC) in which a waveguide is formed on a substrate. A position of a light-emitting point of the semiconductor laser element is approximately aligned with a position of a core of the waveguide. In a plan view, a first line segment representing an emission surface of the semiconductor laser element and a second line segment corresponding to the first line segment and representing an incident surface of the waveguide are arranged oblique to each other, and the light-emitting point of the semiconductor laser element is disposed closer to an intersection point of an extension line of the first line segment and the second line segment or an extension line of the second line segment than a center of the first line segment.

8 Claims, 3 Drawing Sheets

(51) Int. Cl.
*H01L 31/0232* (2014.01)
*G02F 1/35* (2006.01)

(56) References Cited

U.S. PATENT DOCUMENTS

| | | |
|---|---|---|
| 2002/0044745 A1 | 4/2002 | Fernier et al. |
| 2002/0186730 A1* | 12/2002 | Garbuzov ............ G02B 6/4204 372/36 |
| 2009/0180499 A1* | 7/2009 | Wiedmann ............ G02F 1/3501 372/21 |
| 2010/0303110 A1* | 12/2010 | Bhagavatula ........ G02B 6/4245 372/22 |
| 2010/0321766 A1 | 12/2010 | Yoshino |
| 2011/0090557 A1 | 4/2011 | Ide et al. |
| 2012/0057607 A1* | 3/2012 | Pezeshki ............... H01S 5/2036 372/6 |
| 2014/0185980 A1* | 7/2014 | Lei ......................... H01S 5/141 385/14 |
| 2015/0093069 A1 | 4/2015 | Nakamura |
| 2015/0097211 A1* | 4/2015 | Krasulick ........... H01S 5/02272 257/184 |
| 2017/0146744 A1 | 5/2017 | Katsuyama et al. |
| 2018/0284367 A1 | 10/2018 | Oyama |

FOREIGN PATENT DOCUMENTS

| | | | |
|---|---|---|---|
| JP | H08146242 A | 6/1996 | |
| JP | H10078531 A | 3/1998 | |
| JP | H10293223 A | 11/1998 | |
| JP | H11109151 A | 4/1999 | |
| JP | 2000081546 A | 3/2000 | |
| JP | 2000101146 A | 4/2000 | |
| JP | 2000171665 A | 6/2000 | |
| JP | 2001330744 A | 11/2001 | |
| JP | 2002055264 A | 2/2002 | |
| JP | 2009020415 A | 1/2009 | |
| JP | 2011085746 A | 4/2011 | |
| JP | 2015070123 A | 4/2015 | |
| JP | 2019035876 A * | 3/2019 | ............... G02B 6/12 |
| WO | 2009104485 A1 | 8/2009 | |
| WO | 2015170505 A1 | 11/2015 | |
| WO | 2017068843 A1 | 4/2017 | |

* cited by examiner

OPTICAL MODULE

CROSS-REFERENCE TO RELATED APPLICATIONS

This application claims priority to Japanese Patent Application No. 2018-052126 filed on Mar. 20, 2018. The entire disclosure of Japanese Patent Application No. 2018-052126 is hereby incorporated herein by reference.

BACKGROUND

Technical Field

The present invention relates to an optical module including a semiconductor laser and a waveguide.

Related Art

An optical module including a semiconductor laser and a waveguide optically connected with the semiconductor laser is in use in various industrial fields. In such an optical module, a return light beam from the waveguide to the semiconductor laser may adversely affect a resonance state of the semiconductor laser. In order to cope with the problem, there is proposed an optical module in which an end surface of a substrate on which a waveguide is formed and an end surface of the waveguide are formed at different angles (for example, see JP 2001-330744 A).

SUMMARY

In the optical module described in JP 2001-330744 A, since the end surface of the substrate and the end surface of the waveguide are formed at different angles, an optical axis of a light beam emitted from a semiconductor laser and an optical axis of the waveguide are made oblique to each other. As a result, a return light beam from the waveguide to the semiconductor laser can be reduced.

However, when an emission surface of the semiconductor laser and the end surface of the substrate are arranged oblique to each other, a distance between a light-emitting point of the semiconductor laser and an incident surface of the waveguide becomes large because the light-emitting point is typically positioned approximately at a center in a width direction of the semiconductor laser, which leads to a decrease in optical coupling efficiency of the semiconductor laser and the waveguide.

The present disclosure has been made in view of the above problem, and it is an object of the present invention to provide an optical module that has high optical coupling efficiency between a semiconductor laser and a waveguide and is capable of reducing a return light beam from the waveguide to the semiconductor laser.

In order to solve the above problem, an optical module according to an aspect of the present invention includes a semiconductor laser element, and a planar lightwave circuit (PLC) in which a waveguide is formed on a substrate. In the optical module, a position of a light-emitting point of the semiconductor laser element is approximately aligned with a position of a core of the waveguide, and in plan view, a first line segment representing an emission surface of the semiconductor laser element and a second line segment corresponding to the first line segment that represents an incident surface of the waveguide are arranged oblique to each other, and the light-emitting point of the semiconductor laser element is disposed closer to an intersection point of an extension line of the first line segment and the second line segment or an extension line of the second line segment than a center of the first line segment.

As described above, according to the present disclosure, it is possible to provide the optical module that has high optical coupling efficiency between the semiconductor laser and the waveguide and is capable of reducing a return light beam from the waveguide to the semiconductor laser.

DETAILED DESCRIPTION

Figure 1:
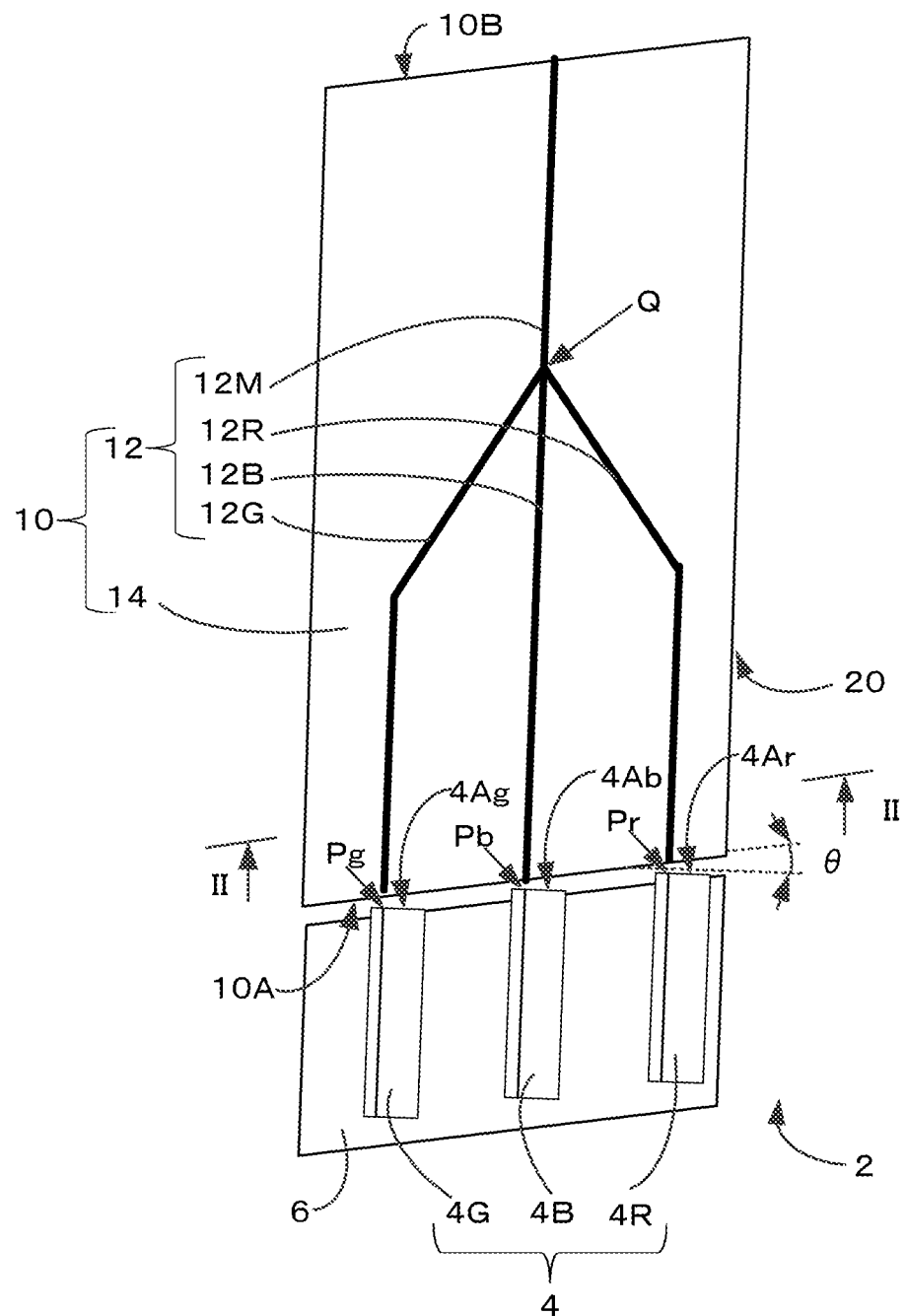
FIG. 1 is a diagram schematically showing an optical module according to an embodiment of the present disclosure.

A description will hereinafter be given of an embodiment of the present invention with reference to the drawings. It is noted that an optical module described below is for embodying a technical idea of the present invention, and the present invention is not limited to the following unless otherwise specified.

In each of the drawings, components having the same function may be given the same reference numeral. Taking ease of explaining and understanding the gist into consideration, a description is given, for convenience of explanation, with a separate embodiment or example, but a partial substitution or combination of configurations shown in different embodiments and examples are possible. In the following embodiment and example, descriptions of matters common to previous descriptions are omitted, and only different points will be described. In particular, the similar actions and effects with the same configuration will not be consecutively mentioned for each embodiment or example. In some cases, the sizes and positional relations of the components shown in the drawings are exaggerated in order to clarify the explanation.

(Optical Module According to an Embodiment)

Figure 2:
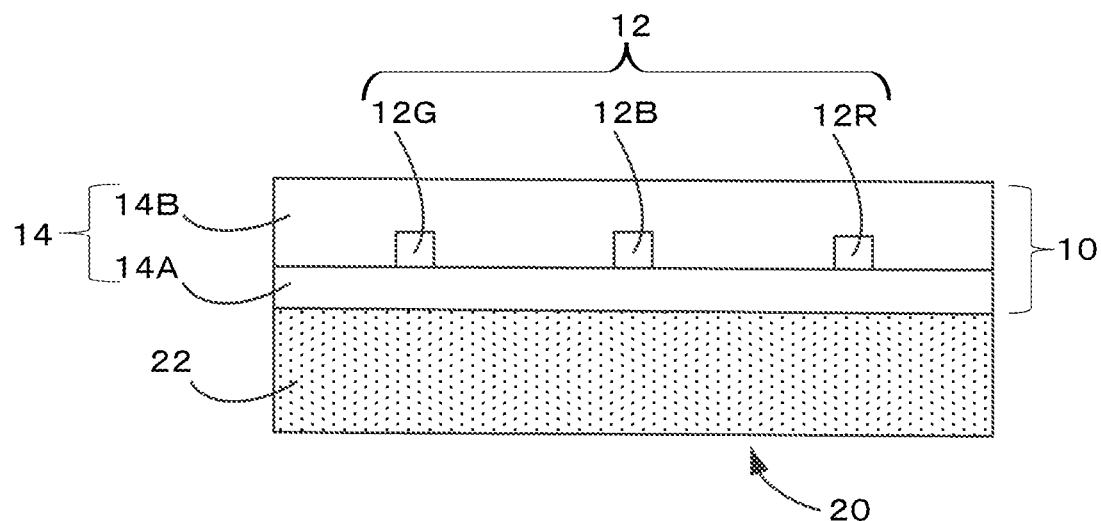
FIG. 2 is a side sectional view showing a II-II section of FIG. 1.

First, a description will be given of a structure of an optical module according to an embodiment of the present invention with referencing to FIG. 1 and FIG. 2. FIG. 1 is a diagram schematically showing the optical module according to an embodiment of the present disclosure. FIG. 2 is a side sectional view showing II-II section of FIG. 1.

An optical module 2 according to the present embodiment includes a semiconductor laser element 4 mounted on a light source substrate 6 and a planar lightwave circuit (PLC) 20 optically connected with the semiconductor laser element 4. In the present embodiment, a case where the semiconductor laser element 4 is configured of a green semiconductor laser element 4G, a blue semiconductor laser element 4B, and a red semiconductor laser element 4R is described as an example.

In the present embodiment, a nitride semiconductor laser whose oscillation wavelength is in the green region may be used as the green semiconductor laser element 4G, a nitride semiconductor laser whose oscillation wavelength is in the ultraviolet or blue region may be used as the blue semiconductor laser element 4B, and a gallium arsenide (GaAs)-based semiconductor laser whose oscillation wavelength is in the red or infrared region may be used as the red semiconductor laser element 4R.

However, the present invention is not limited to such a configuration, and the optical module 2 may include any number (one or more) of semiconductor laser elements having any wavelength ranges.

As shown in FIG. 2, in the planar lightwave circuit 20, an undercladding layer 14A made of, for example, $SiO_2$, may be formed on a substrate 22, which may, for example, be a silicon substrate, a core 12 made of, for example, $SiO_2$, is formed on the undercladding layer 14A, and an overcladding layer 14B made of, for example, $SiO_2$ is formed to cover the core 12. The core 12 has a refractive index higher than a refractive index of cladding 14, thereby allowing a light beam incident on the core 12 through an incident surface 10A of a waveguide 10 to be totally reflected at a boundary surface between the core 12 and the cladding 14, and then travel through the core 12. The substrate 22 may be other than silicon. Materials used for semiconductor substrates such as gallium arsenide, gallium nitride, aluminum nitride and the like, and transparent materials such as polyimide can also be used. The material of the waveguide 10 may be other than $SiO_2$. The material of the waveguide 10 may be PMMA (polymethyl methacrylate), polyimide resin (polyimide resin, poly (imide.isoindoloquinazolinedione imide) resin, polyether imide resin, polyether ketone resin, polyester imide resin, etc.) A silicone resin, a polystyrene resin, a polycarbonate resin, a polyamide resin, a polyester resin, a phenol resin, a polyquinoline resin, a polyquinoxaline resin, a polybenzoxazole resin, a polybenzothiazole resin, a polybenzimidazole resin or the like. A polyimide resin containing fluorine is preferable because it has high light transmittance and low refractive index.

In the present embodiment, the core 12 may include a green corresponding core 12G corresponding to the green semiconductor laser element 4G, a blue corresponding core 12B corresponding to the blue semiconductor laser element 4B, and a red corresponding core 12R corresponding to the red semiconductor laser element 4R. As shown in FIG. 1, in a plan view, light-emitting points Pg, Pb, Pr of the semiconductor laser elements 4G, 4B, 4R are approximately aligned with the cores 12G, 12B, 12R of the waveguide 10, respectively. The cores 12G, 12B, 12R extending from the incident surface 10A of the waveguide 10 to an emission side merge with each other at a confluence point Q, and a multiplexing corresponding core 12M extends to an emission surface 10B of the waveguide 10.

As described above, the optical module 2 according to the present embodiment includes the plurality of semiconductor laser elements 4G, 4B, 4R that emit light beams in the green region, the blue region, and the red region, and the planar lightwave circuit 20 includes the cores 12G, 12B, 12R corresponding to the semiconductor laser elements 4G, 4B, 4R having respective wavelengths, and the waveguide 10 including the multiplexing corresponding core 12M into which the cores 12G, 12B, 12R merge. As a result, light beams with respective wavelengths can be multiplexed by the planar lightwave circuit 20. Such a configuration makes it possible to provide the optical module 2 that is compact and capable of emitting a white light beam with high luminous efficiency.

<Oblique Arrangement of Emission Surface of Semiconductor Laser Element and Incident Surface of Waveguide>

Figure 3:
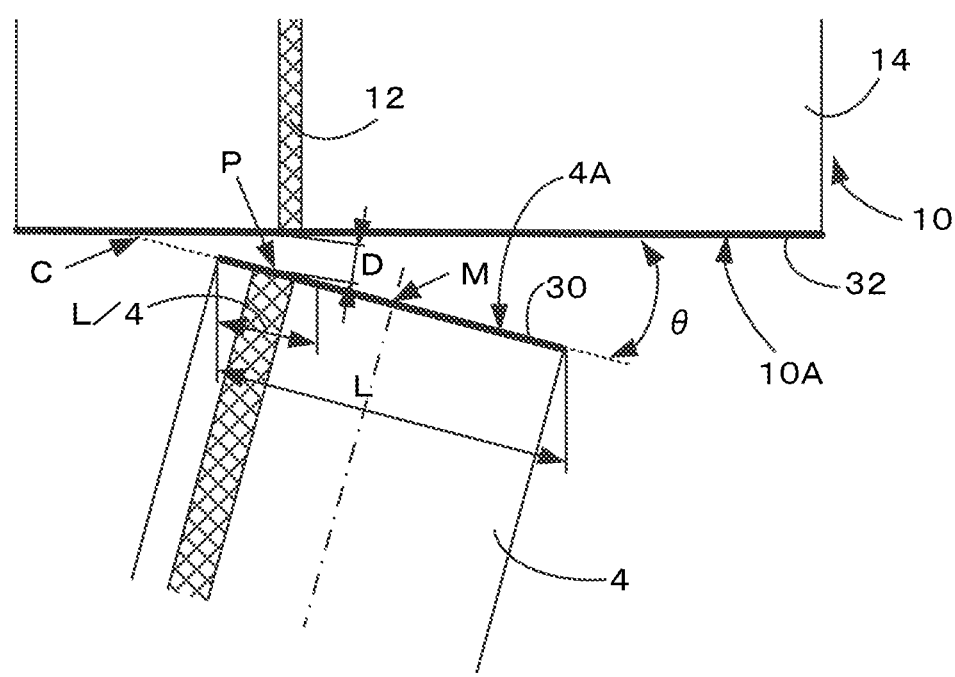
FIG. 3 is an enlarged plan view showing that a first line segment representing an emission surface of a semiconductor laser element and a second line segment corresponding to the first line segment that represents an incident surface of a waveguide are arranged oblique to each other.

In the optical module according to the present embodiment, emission surfaces 4Ag, 4Ab, 4Ar of the semiconductor laser elements 4G, 4B, 4R and the incident surface 10A, which corresponds to the emission surfaces 4Ag, 4Ab, 4Ar, of the waveguide 10 of the planar lightwave circuit 20 are arranged oblique to each other. A description will be given in more detail of this structure with reference to FIG. 3. FIG. 3 is an enlarged plan view showing that a first line segment 30 representing the emission surface 4A of the semiconductor laser element 4 and a second line segment 32 corresponding to the first line segment 30 and representing the incident surface 10A of the waveguide 10 are arranged oblique to each other.

It is noted that the semiconductor laser element 4 and the core 12 shown in FIG. 3 are applicable to any of green, blue, and red pairs of the semiconductor laser elements 4G, 4B, 4R and the cores 12G, 12B, 12R shown in FIG. 1. Further, as long as the emission surface of the semiconductor laser element and the incident surface, which corresponds to the emission surface, of the waveguide of the planar lightwave circuit are arranged oblique to each other, a configuration where the incident surface of the planar lightwave circuit is obliquely cut or a configuration where the planar lightwave circuit having a typical rectangular shape in plan view is disposed oblique to the emission surface of the semiconductor laser element may be employed.

As shown in FIG. 3, in a plan view, the first line segment 30 representing the emission surface 4A of the semiconductor laser element 4 and the second line segment 32 corresponding to the first line segment 30 that represents the incident surface 10A of the waveguide 10 are arranged at an angle θ with respect to each other. A light-emitting point P of the semiconductor laser element 4 is disposed closer to an intersection point C of an extension line of the first line segment 30 and the second line segment 32 or an extension line of the second line segment 32 than a center M of the first line segment 30.

A light beam emitted from the semiconductor laser element 4 enters the core 12 through the incident surface 10A of the waveguide 10 and travels through the core 12 to the emission side and is emitted through the emission surface 10B of the waveguide 10 (see FIG. 1). At this time, a light beam reflected by the incident surface 10A and the emission surface 10B of the waveguide 10 returns toward the semiconductor laser element 4. When such a return light beam enters the semiconductor laser element 4, the resonance state of the semiconductor laser element 4 is adversely affected. Due to the influence of this return light beam, noise is generated in a laser light beam, which may make it difficult to produce a coherent laser light beam.

However, in the present embodiment, since the emission surface 4A of the semiconductor laser element 4 and the incident surface 10A, which corresponds to the emission surface 4A, of the waveguide 10 are arranged oblique to each other, the return light beam from the planar lightwave circuit 20 to the semiconductor laser element 4 can be suppressed, which thereby makes it possible to suppress an adverse effect on the resonance state of the semiconductor laser element 4. In addition, since the light-emitting point P of the semiconductor laser element is disposed closer to the intersection point C than the center M of the first line segment 30, the light-emitting point P on the emission surface 4A of the semiconductor laser element 4 can be set close to the position of the core 12 on the incident surface 10A of the waveguide 10, which thereby makes it possible to suppress a decrease in optical coupling efficiency of the semiconductor laser element 4 and the planar lightwave circuit 20. Accordingly, it is possible to provide the highly reliable optical module 2 with high luminous efficiency.

Further, when a length of the first line segment 30 is denoted by L, it is preferable that the light-emitting point P be disposed within a distance L/4 from an end adjacent to the intersection point C of the first line segment 30. This makes it possible to more reliably suppress the decrease in the optical coupling efficiency of the semiconductor laser element 4 and the planar lightwave circuit 20. In particular, taking the coupling efficiency of the semiconductor laser element 4 and the planar lightwave circuit 20 into consideration, a distance D between the position of the light-emitting point P on the emission surface 4A of the semiconductor laser element 4 and the position of the core 12 on the incident surface 10A of the waveguide 10 is preferably less than or equal to 5 μm. This makes it possible to provide the optical module 2 with excellent luminous efficiency.

For example, assuming that the length L of the first line segment 30 is 150 μm and the angle θ formed by the first line segment 30 and the second line segment 32 is 8°, when the light-emitting point P on the emission surface 4A of the semiconductor laser element 4 is positioned at the distance L/4 from the end adjacent to the intersection point C, the distance D between the position of the light-emitting point P on the emission surface 4A and the position of the core 12 on the incident surface 10A is represented by D=(L/4)*tan θ≈5 μm. As a result, it is possible to reliably provide the optical module 2 with excellent luminous efficiency.

Figure 4:
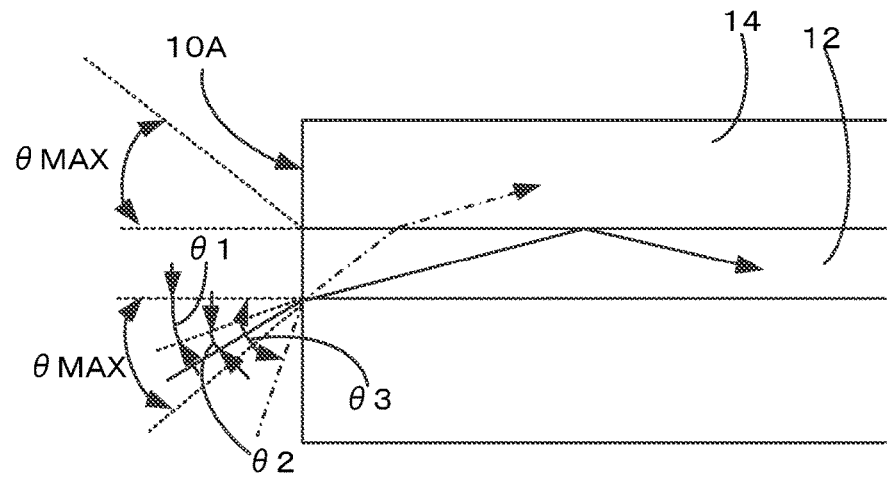
FIG. 4 is a plan view showing a relation among an angle $\theta 1$ formed by an optical axis of a light beam incident on a core of the waveguide from the semiconductor laser element and an optical axis of the core, a divergence angle (half value) $\theta 2$ of a light beam emitted from the semiconductor laser element, and a maximum acceptance angle (half value) $\theta max$ of the waveguide of a planer lightwave circuit.

With reference to FIG. 4, there is described below a relation among an angle θ1 formed by an optical axis of a light beam incident on the core 12 and an optical axis of the core 12, a divergence angle (half value) θ2 of the semiconductor laser element 4, and a maximum acceptance angle (half value) θmax of the waveguide 10 of the planar lightwave circuit. FIG. 4 is a plan view showing the relation among the angle θ1 formed by the optical axis of the light beam incident on the core 12 of the waveguide 10 from the semiconductor laser element 4 and the optical axis of the core 12, the divergence angle (half value) θ2 of a light beam emitted from the semiconductor laser element 4, and the maximum acceptance angle (half value) θmax of the waveguide 10 of the planar lightwave circuit 20.

As shown in FIG. 4, assuming that a divergence angle (half value) that is a maximum incident angle at which the light beam incident on the core 12 is totally reflected inside the core 12 is denoted by θmax, θmax is determined by a refractive index n1 of the core 12 and a refractive index n2 of the cladding 14 based on the Snell's law as represented by the following equation:

$$\sin \theta_{max}(\text{opening } NA) = n1 * \text{SQR}(2\Delta)$$

$$\Delta = (n1^2 - n2^2)/(2*n1^2)$$

where n1 represents the refractive index of the core 12, and n2 represents the refractive index of the cladding 14.

Assuming that the angle formed by the optical axis of the light beam incident on the core 12 from the semiconductor laser element 4 and the optical axis of the core 12 is denoted by θ1 (theoretical value), the divergence angle (half value) of the light beam emitted from the semiconductor laser element 4 is denoted by θ2, and the maximum acceptance angle (half value) of the waveguide 10 is denoted by θmax, when θ1+θ2≤θmax is satisfied, the light beam incident on the core 12 from the semiconductor laser element 4 is totally reflected inside the core 12. That is, when the above relational expression is satisfied, the light beam emitted from the semiconductor laser element 4 enters the core 12 of the waveguide 10 and travels through the core 12 to the emission side.

On the other hand, when the angle formed by the optical axis of the light beam incident on the core 12 from the semiconductor laser element 4 and the optical axis of the core 12 is an angle θ3 larger than θmax, the light beam is not reflected inside the core 12 and hence cannot travel through the core 12.

As described above, when the angle θ1 formed by the optical axis of the light beam incident on the core 12 from the semiconductor laser element 4 and the optical axis of the core 12 has a predetermined value in a range of greater than 0° and less than or equal to "θmax−θ2", it is possible to reliably suppress the return light beam to the semiconductor laser element 4. The range of greater than 0° and less than or equal to "θmax−θ2" has a certain size; thus, it is relatively easy to set the angle θ1 and to form a structure capable of suppressing the return light beam to the semiconductor laser element 4.

In particular, it is preferable to dispose the semiconductor laser element 4 so that the divergence angle θ2 of the semiconductor laser element 4 in plan view becomes a divergence angle in a minor axis direction of a far field pattern (FFP) of the semiconductor laser element 4. In this case, since the divergence angle θ2 can be made small, the value of the angle θ1 set less than or equal to "θmax−θ2" can be increased. As a result, the return light beam to the semiconductor laser element 4 can be more reliably suppressed.

Figure 5:
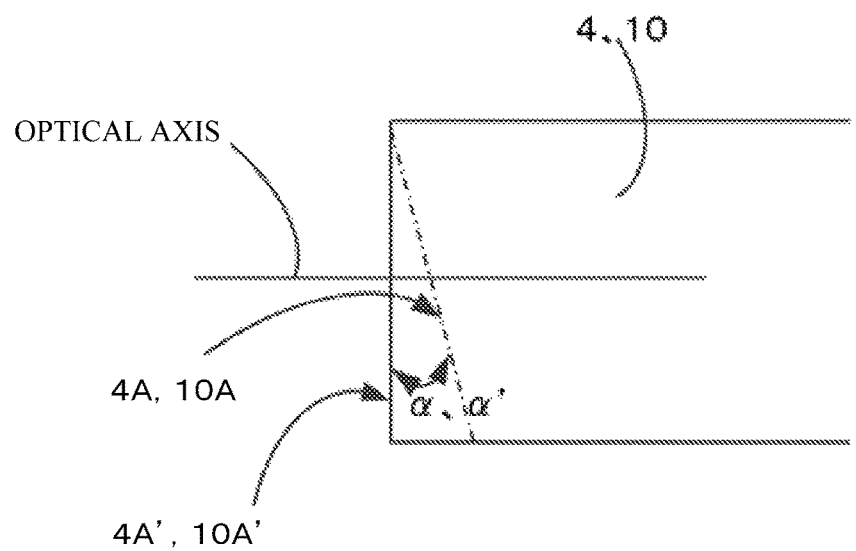
FIG. 5 is a plan view for describing a method of calculating the angle $\theta 1$ based on an angle $\theta$ formed by the first line segment the second line segment.

If the actual emission surface 4A of the semiconductor laser element 4 is perfectly orthogonal to the optical axis of the light beam emitted from the semiconductor laser element 4 and the actual incident surface 10A of the waveguide 10 is perfectly orthogonal to the optical axis of the core 12, the angle θ1 formed by the optical axis of the light beam incident on the core 12 from the semiconductor laser element 4 and the optical axis of the core 12 is identical to the angle θ formed by the first line segment 30 and the second line segment 32. However, due to variation in manufacturing accuracy and in the FFP of the semiconductor laser element or the like, the actual emission surface 4A and the incident surface 10A have slight angle deviations from the theoretical emission surface and incident surface. This will be described with reference to FIG. 5. FIG. 5 is a plan view for describing a method of calculating the angle θ1 that is a theoretical value based on the angle θ formed by the first line segment 30 corresponding to the actual emission surface 4A and the second line segment 32 corresponding to the actual incident surface 10A.

FIG. 5 shows a deviation angle α between a theoretical emission surface 4A' orthogonal to the optical axis of the light beam emitted from the semiconductor laser element 4 and the actual emission surface 4A, and a deviation angle α' between a theoretical incident surface 10A' orthogonal to the optical axis of the core 12 of the waveguide 10 and the actual incident surface 10A. It is possible to calculate the angle θ1 that is a theoretical value through a correction in which each of the deviations α, α' is added to or subtracted from the angle θ formed by the first line segment 30 and the second line segment 32 corresponding to the actual surfaces.

It is noted that, for such a correction, whether to add or subtract the deviation angle α (α') to or from the angle θ is determined by a direction of the inclination of the incident light beam with respect to the optical axis of the core 12 and a direction of the deviation angle α (α').

(Flip-Chip Mounted Optical Module)

Figure 6:
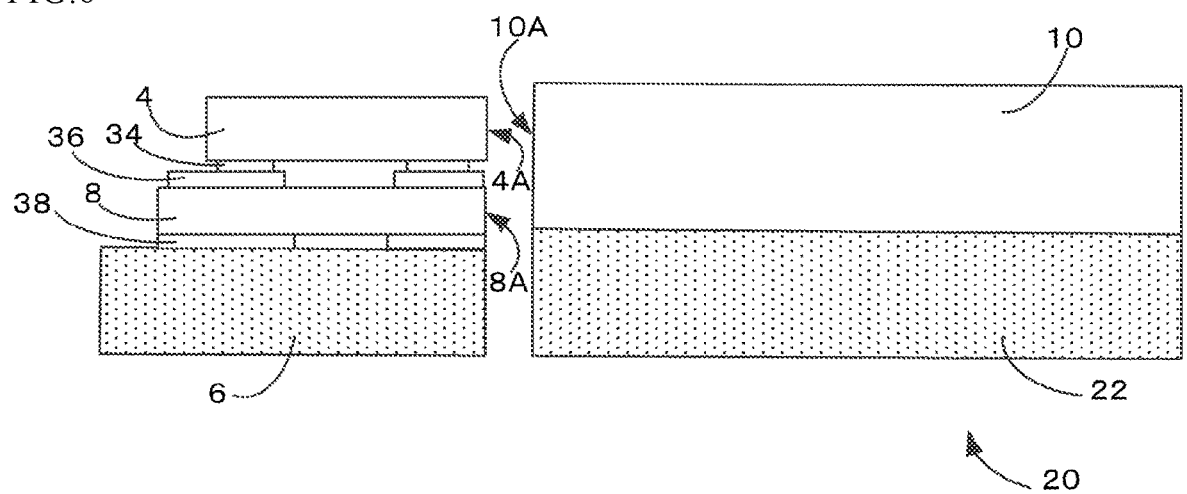
FIG. 6 is a side view schematically showing a structure of the optical module that has been flip-chip mounted.

With reference to FIG. 6, there will be given below a description of a configuration where the optical module 2 is flip-chip mounted. FIG. 6 is a side view schematically showing the structure of the optical module 2 that has been flip-chip mounted. In the optical module 2 shown in FIG. 6, the semiconductor laser element 4 includes positive and negative electrodes 34 on a lower surface side of the semiconductor laser element 4, and is mounted on the light source substrate 6 via a submount 8. The electrodes 34 of the semiconductor laser element 4 and the submount 8 are connected to each other with a metal bonding layer 36, and the submount 8 and the light source substrate 6 are connected to each other with a metal bonding layer 38, and such a metal bonding layer includes solder.

In particular, a side surface 8A of the submount 8 on the emission surface side of the semiconductor laser element 4 is disposed approximately parallel to the incident surface 10A of the waveguide 10. This allows amounts of protrusion of the semiconductor laser element 4 and the submount 8 to be identical to each other, which thereby makes it possible to easily dispose the semiconductor laser element 4 close to the planar lightwave circuit 20 (the waveguide 10). As a result, the decrease in the optical coupling efficiency of the semiconductor laser element 4 and the planar lightwave circuit 20 can be effectively suppressed.

The embodiment and aspect of the present invention have been described. However, configuration details of the disclosure content may be changed, and changes in the combination or order of components in the embodiment and aspect can be made without departing from the claimed scope and idea of the present invention.

What is claimed is:

1. An optical module comprising:
   a semiconductor laser element; and
   a planar lightwave circuit in which a waveguide is formed on a substrate,
   wherein a position of a light-emitting point of the semiconductor laser element is approximately aligned with a position of a core of the waveguide,
   in a plan view, a first line segment representing an emission surface of the semiconductor laser element and a second line segment corresponding to the first line segment and representing an incident surface of the waveguide are arranged oblique to each other, and
   the light-emitting point of the semiconductor laser element is disposed closer to an intersection point of an extension line of the first line segment and the second line segment or an extension line of the second line segment than a center of the first line segment, and
   wherein an angle formed by an optical axis of a light beam incident on the core from the semiconductor laser element and an optical axis of the core is denoted by θ1, a divergence angle (half value) of a light beam emitted from the semiconductor laser element is denoted by θ2, and a maximum acceptance angle (half value) of the waveguide is denoted by θmax, and θ1, θ2 and θmax satisfy θ1+θ2≤θmax.

2. The optical module according to claim 1, wherein a distance between the position of the light-emitting point on the emission surface of the semiconductor laser element and the position of the core on the incident surface of the planar lightwave circuit is less than or equal to 5 μm.

3. The optical module according to claim 1, wherein θ2 corresponds to a divergence angle (half-value) in a minor axis direction of a far field pattern of the semiconductor laser element.

4. The optical module according to claim 1, wherein the semiconductor laser element and the planar lightwave circuit are flip-chip mounted, and a side surface of a submount on an emission surface side of the semiconductor laser element is disposed approximately parallel to the incident surface of the planar lightwave circuit.

5. The optical module according to claim 1, wherein a length of the first line segment is denoted by L, the light-emitting point is disposed within a distance L/4 from an end adjacent to the intersection point of the extension line of the first line segment and the second line segment or the extension line of the second line segment.

6. The optical module according to claim 1, comprising a plurality of the semiconductor laser elements that emit light beams in a blue region, a green region, and a red region, wherein
   the planar lightwave circuit includes the waveguide comprising a plurality of cores corresponding to the semiconductor laser elements having respective wavelengths and a multiplexing corresponding core into which the plurality of cores merge, and light beams with respective wavelengths are multiplexed by the planar lightwave circuit.

7. The optical module according to claim 1, wherein the substrate comprises silicon.

8. The optical module according to claim 1, wherein the optical module emits a white light beam.

* * * * *